United States Patent
Kim

(10) Patent No.: US 11,626,570 B2
(45) Date of Patent: Apr. 11, 2023

(54) DISPLAY DEVICE

(71) Applicant: LG Display Co., Ltd., Seoul (KR)

(72) Inventor: Mi-Ae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 343 days.

(21) Appl. No.: 17/136,566

(22) Filed: Dec. 29, 2020

(65) Prior Publication Data
US 2021/0202890 A1 Jul. 1, 2021

(30) Foreign Application Priority Data

Dec. 30, 2019 (KR) .................... 10-2019-0178634

(51) Int. Cl.
| | |
|---|---|
| *G02B 5/30* | (2006.01) |
| *H01L 51/52* | (2006.01) |
| *H01L 27/32* | (2006.01) |
| *H01L 41/193* | (2006.01) |

(52) U.S. Cl.
CPC ........ *H01L 51/5234* (2013.01); *G02B 5/3083* (2013.01); *H01L 27/322* (2013.01); *H01L 27/3246* (2013.01); *H01L 27/3262* (2013.01); *H01L 41/193* (2013.01); *H01L 51/5212* (2013.01); *H01L 51/5215* (2013.01); *H01L 51/5228* (2013.01)

(58) Field of Classification Search
CPC ....... G02B 5/3083–3091; G06F 1/1605; G06F 1/1637; H01L 27/3225; H01L 41/193
See application file for complete search history.

(56) References Cited

U.S. PATENT DOCUMENTS

2018/0160248 A1* 6/2018 Murakami ........... H04R 31/003

FOREIGN PATENT DOCUMENTS

KR 10-2007-0010573 A 1/2007

* cited by examiner

*Primary Examiner* — Daniel P Shook
(74) *Attorney, Agent, or Firm* — Birch, Stewart, Kolasch & Birch, LLP

(57) ABSTRACT

A display device includes a first substrate and a second substrate at which a display area for displaying an image and a non-display area surrounding the display area are provided; a light-emitting diode in the display area on an inner surface of the first substrate and including an anode electrode, a light-emitting layer and a cathode electrode; and a piezoelectric element in the display area on an inner surface of the second substrate and including a first electrode, a piezoelectric layer and a second electrode, wherein the piezoelectric layer includes dichroic dyes.

23 Claims, 5 Drawing Sheets

DISPLAY DEVICE

CROSS-REFERENCE TO RELATED APPLICATION

The present application claims priority from and the benefit under 35 U.S.C § 119(a) of Korean Patent Application No. 10-2019-0178634 filed in the Republic of Korea on Dec. 30, 2019, the entire contents of which are hereby incorporated by reference in its entirety into the present application.

BACKGROUND OF THE INVENTION

Field of the Disclosure

The present disclosure relates to a display device, and more particularly, a display device including a piezoelectric element having a speaker function and a polarizer function.

Background

Recently, with entering into a full-fledged information age, there is a growing interest in information displays dealing with and displaying mass information. In addition, as the demand to use portable information media increases, various lightweight and thin flat panel display devices corresponding to this have been developed and have been in the spotlight.

Particularly, among the various flat panel display devices, an electroluminescent display device can be lightweight and thin because it is self-luminous and does not require a backlight unit used for a liquid crystal display device, which is a nonluminous device, and the electroluminescent display device has advantages in power consumption.

The electroluminescent display device is driven by low voltages of direct current (DC) and has a fast response time. Further, the electroluminescent display device is strong against the external impacts and is used in a wide range of temperatures because its components are solids. In addition, the electroluminescent display device is manufactured at relatively low costs.

The electroluminescent display device is widely applied to electronic devices such as monitors of computers or televisions as well as portable electronic devices such as smart phones or tablet PCs to provide various types of information in various ways.

By the way, reflection of the external light is high in the electroluminescent display device, the brightness of the black state increases due to the reflection of the external light, thereby reducing the contrast ratio and lowering the image quality. Accordingly, a polarizer is attached to a front surface of the electroluminescent display device, thereby prevent the reflection of the external light.

Meanwhile, an electronic device in which an electroluminescent display device is applied includes a speaker to provide audio information. Such a speaker is attached to the electroluminescent display device. In this case, however, since sound from the speaker is formed and reflected at a bottom of a screen to be heard, sound field is narrow and sound quality is lowered.

Further, the electronic device is manufactured by separately attaching the polarizer and the speaker to the electroluminescent display device, thereby increasing the manufacturing costs and limiting a light weight, slim thickness and compact size.

SUMMARY OF THE INVENTION

Accordingly, the present disclosure is directed to a display device that substantially obviates one or more of the problems due to limitations and disadvantages of the related art.

An object of the present disclosure is to provide a display device including a piezoelectric element having a speaker function and a polarizer function, which addresses the limitations and disadvantages associated with the related art.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided a display device that includes a first substrate and a second substrate at which a display area displaying an image and a non-display area surrounding the display area are provided; a light-emitting diode in the display area on an inner surface of the first substrate and including an anode electrode, a light-emitting layer and a cathode electrode; and a piezoelectric element in the display area on an inner surface of the second substrate and including a first electrode, a piezoelectric layer and a second electrode, wherein the piezoelectric layer includes dichroic dyes.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate embodiments of the present disclosure and together with the description serve to explain the principles of the present disclosure. In the drawings.

DETAILED DESCRIPTION OF THE EMBODIMENTS

Reference will now be made in detail to embodiments of the disclosure, examples of which are illustrated in the accompanying drawings. All the components of a display device according to all embodiments of the present disclosure are operatively coupled and configured.

First Embodiment

Figure 1:
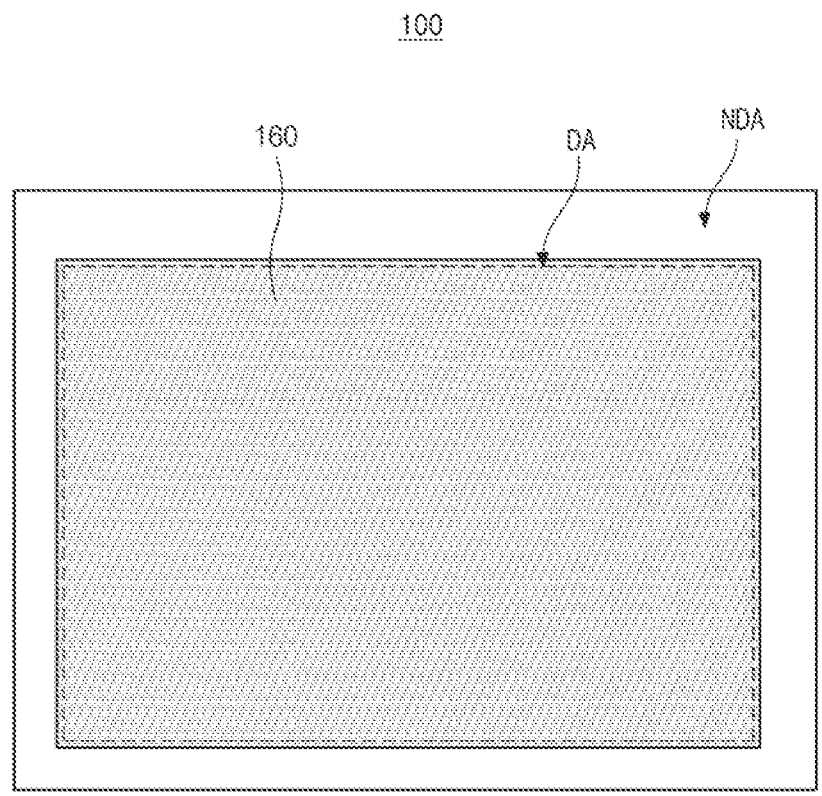
FIG. 1 is a plan view of a display device according to a first embodiment of the present disclosure.

FIG. 1 is a schematic plan view of a display device according to a first embodiment of the present disclosure and shows an electroluminescent display device.

In FIG. 1, a display device 100 according to the first embodiment of the present disclosure includes a display area DA displaying an image and a non-display area NDA surrounding the display area DA.

Further, a plurality of pixels are arranged in a matrix form in the display area DA, and each pixel includes a light-emitting diode. In addition, each pixel can further include at least one thin film transistor and at least one capacitor.

A pad portion and a link portion are provided in the non-display area NDA in order to apply signals to the plurality of pixels of the display area DA. The pad portion is connected to an outer driving circuit and the link portion connects the pad portion with lines of the display area DA.

Meanwhile, the display device 100 according to the first embodiment of the present disclosure includes a piezoelectric element 160. The piezoelectric element 160 is formed substantially all over in the display area DA.

Further, the piezoelectric element 160 includes a first electrode, a second electrode and a piezoelectric layer therebetween. The first and second electrodes can be connected to the outer driving circuit in the non-display area NDA.

The piezoelectric element 160 functions as a speaker and a polarizer, and this will be described in detail later.

Figure 2:
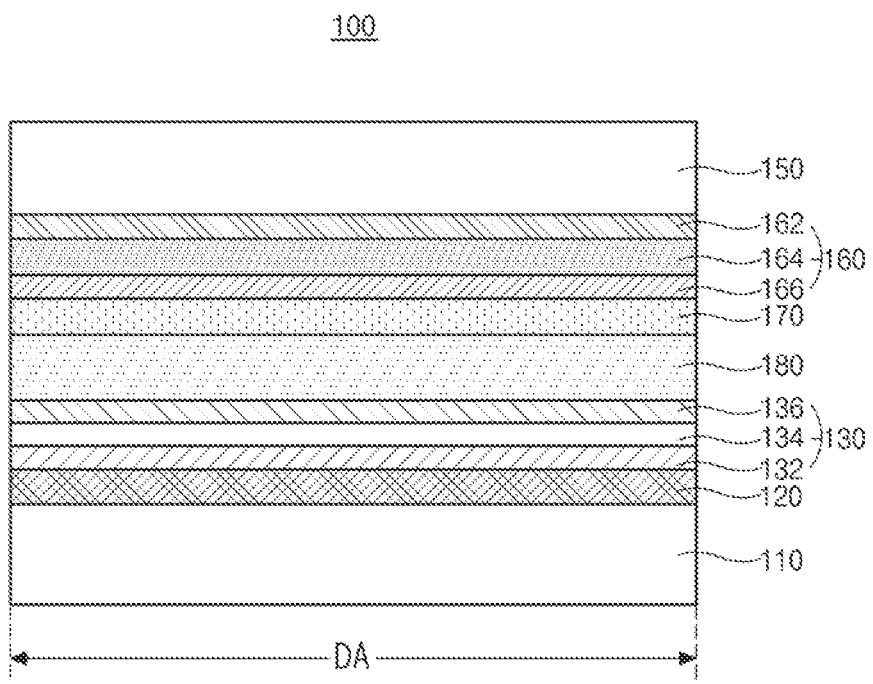
FIG. 2 is a cross-sectional view of the display device according to the first embodiment of the present disclosure.

FIG. 2 is a schematic cross-sectional view of the display device 100 according to the first embodiment of the present disclosure and shows a cross-section corresponding to the display area DA of FIG. 1.

In FIG. 2, the display device 100 according to the first embodiment of the present disclosure includes a first substrate 110, a second substrate 150, a driving element layer 120, a light-emitting diode 130, a piezoelectric element 160, a phase retardation film 170 and a filling layer 180.

More specifically, the first substrate 110 and the second substrate 150 can be a glass substrate or a plastic substrate. For example, polyimide (PI) or polycarbonate (PC) can be used for the plastic substrate, but is not limited thereto.

The driving element layer 120 can be formed in the display area DA on an inner surface of the first substrate 110. The driving element layer 120 is formed by stacking a plurality of patterns and a plurality of insulation layers. The driving element layer 120 can include a plurality of lines and elements. For example, the driving element layer 120 can include at least one thin film transistor and at least one capacitor, which are formed at each pixel.

An anode electrode 132 is formed on the driving element layer 120. The anode electrode 132 can be formed separately at each pixel.

The anode electrode 132 is formed of a conductive material having relatively high work function. For example, the anode electrode 132 can be formed of a transparent conductive material such as indium tin oxide (ITO) or indium zinc oxide (IZO), but is not limited thereto.

Meanwhile, the display device 100 according to the first embodiment of the present disclosure can be a top emission type in which light of the light-emitting diode 130 is output toward a direction opposite the first substrate 110, that is, output to the outside through the second substrate 150. Accordingly, the anode electrode 132 can further include a reflective electrode or a reflective layer, which is formed of a metal material having relatively high reflectance, under the transparent conductive material layer. For example, the reflective electrode or the reflective layer can be formed of aluminum-palladium-copper (APC) alloy, silver (Ag) or aluminum (Al). At this time, the anode electrode 132 can have a triple-layered structure of ITO/APC/ITO, ITO/Ag/ITO or ITO/Al/ITO, but is not limited thereto.

A light-emitting layer 134 is formed on the anode electrode 132. The light-emitting layer 134 can include a first charge auxiliary layer, a light-emitting material layer and a second charge auxiliary layer sequentially disposed on the anode electrode 132. The light-emitting material layer can be formed of a white luminescent material. Alternatively, the light-emitting material layer can be formed of any one of red, green and blue luminescent materials or can include all the red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto, and other variations are possible.

A cathode electrode 136 of a conductive material having a relatively low work function is formed on the light-emitting layer 134. For example, the cathode electrode 136 can be formed of aluminum (Al), magnesium (Mg), silver (Ag), or an alloy thereof. The cathode electrode 136 can have a relatively thin thickness such that light from the light-emitting layer 134 can be transmitted therethrough. Alternatively, the cathode electrode 136 can be formed of a transparent conductive material such as indium-gallium-oxide (IGO), but is not limited thereto.

The anode electrode 132, the light-emitting layer 134 and the cathode electrode 136 constitute the light-emitting diode 130.

Next, a first electrode 162, a piezoelectric layer 164 and a second electrode 166 are sequentially formed in the display area DA on an inner surface of the second substrate 150. For instance, prior to assembling, the first electrode 162, the piezoelectric layer 164 and the second electrode 166 can be sequentially formed on a surface of the second substrate 150, and then the phase retardation film 170 (to be discussed later in more detail) can be formed thereon. Such compiled structure then can be combined with the other compiled structures such the light-emitting diode 130 formed on the layers 120 and 110 as well as the filling layer 180. The first electrode 162, the piezoelectric layer 164 and the second electrode 166 constitute the piezoelectric element 160.

The first electrode 162 and the second electrode 166 are formed of a transparent conductive material. For example, the first electrode 162 and the second electrode 166 can be formed of indium tin oxide (ITO), indium zinc oxide (IZO), metal oxide, silver nanowire or carbon nanotube, but is not limited thereto. Here, the first electrode 162 and the second electrode 166 can be formed of the same material. Alternatively, the first electrode 162 and the second electrode 166 can be formed of different materials.

The piezoelectric layer 164 between the first electrode 162 and the second electrode 166 is formed of a piezoelectric polymer in which mechanical deformation is generated by an electrical signal. Thus, when a voltage is applied to the first and second electrodes 162 and 166, the piezoelectric layer 164 is contracted or expanded. The piezoelectric polymer can be a cellulose-based electro-active polymer or polyvinylidene fluoride.

Here, the cellulose-based electro-active polymer can have a structure expressed by the following chemical formula 1.

Chemical Formula 1

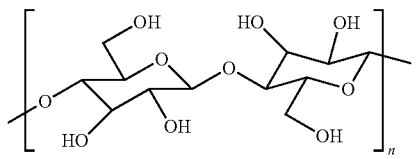

The piezoelectric layer 164 is stretched along a first direction. Therefore, molecules of the piezoelectric layer 164 are arranged in the first direction, and the piezoelectric effect is maximized.

Here, the piezoelectric layer 164 can be mechanically stretched. Namely, the piezoelectric layer 164 can be formed by fixing opposite ends of the piezoelectric film formed of a piezoelectric polymer with a tool such as a clip, pulling it outward and stretching it.

At this time, when the piezoelectric film is stretched in a direction of 45 degrees with respect to a length or width direction of the piezoelectric film, a relatively high piezoelectric constant value can be obtained. For example, the piezoelectric film formed of a cellulose-based electro-active polymer can have a piezoelectric constant value of about 27.3~70 pC/N, and the piezoelectric film formed of polyvinylidene fluoride can have a piezoelectric constant value of about 21 pC/N.

The piezoelectric layer 164 can be separately stretched and then can be attached to the first electrode 162. Alternatively, the piezoelectric layer 164 can be formed on the first electrode 162 and then can be stretched together with the first electrode 162, but is not limited thereto.

Meanwhile, the piezoelectric layer 164 can be chemically stretched. For example, the piezoelectric layer 164 can be stretched using corona discharge. That is, the first electrode 162 and the piezoelectric layer 164 can be formed on the second substrate 150, a tungsten wire can be disposed over the piezoelectric layer 164, and a voltage can be applied to the first electrode 162 and the tungsten wire. Accordingly, a positive corona discharge can occur over the piezoelectric layer 164, and molecules of the piezoelectric layer 164 can be arranged in a direction.

Alternatively, the piezoelectric layer 164 can be chemically stretched using a magnetic field. At this time, the stretching direction of the piezoelectric layer 164 can be controlled according to a direction and strength of the magnetic field.

In addition, the piezoelectric layer 164 can further include an additional inorganic material or organic material to improve properties, but is not limited thereto.

Meanwhile, the piezoelectric layer 164 can include dichroic dyes. Here, the dichroic dyes can be iodine. The dichroic dyes can be arranged along the stretching direction of the piezoelectric layer 164, that is, the first direction.

The piezoelectric layer 164 including the dichroic dyes has a polarizing function. At this time, as the content of the dichroic dyes increases, the optical properties decrease.

Thus, the dichroic dyes are beneficially contained such that the degree of polarization of the piezoelectric layer 164 is 90% to 99% and the transmittance including the surface reflectance is 40% to 45%. For example, the content of the dichroic dyes can be 2 to 30 parts by weight based on 100 parts by weight of the piezoelectric polymer forming the piezoelectric layer 164, preferably 5 to 20 parts by weight, and more preferably 6 to 15 parts by weight. However, the content of the dichroic dyes in the present disclosure is not limited thereto as long as the degree of polarization and the transmittance are satisfied.

The phase retardation film 170 is formed in the display area DA on the second electrode 166. The phase retardation film 170 can be a quarter wave plate (QWP) having a phase retardation value of $\lambda/4$ and changing a polarization state of light. The phase retardation film 170 changes incident linearly polarized light into circularly polarized light and changes incident circularly polarized light into linearly polarized light. An optical axis of the phase retardation film 170 forms 45 degrees with respect to the stretching direction of the piezoelectric layer 164, that is, the first direction.

The phase retardation film 170 can be formed by coating and polymerizing a reactive mesogen. In this case, an alignment layer can be further formed to arrange the reactive mesogen. Alternatively, the phase retardation film 170 can be formed of polycarbonate, tri-acetyl cellulose (TAC), acryl, or polyethylene terephthalate (PET), but is not limited thereto.

Next, the filling layer 180 is formed between the first substrate 110 and the second substrate 150. Namely, the filling layer 180 is disposed between the light-emitting diode 130 of the first substrate 110 and the phase retardation film 170 of the second substrate 150. The filling layer 180 can be formed of a photocurable or thermosetting material.

Further, a seal pattern surrounding the display area DA is formed in the non-display area NDA of FIG. 1 between the first substrate 110 and the second substrate 150. The seal pattern can be a dam structure, and the filling layer 180 can be disposed inside the seal pattern.

As described above, the display device 100 according to the first embodiment of the present disclosure includes the piezoelectric element 160 in the display area DA. When an electrical signal is applied to the first and second electrodes 162 and 166 of the piezoelectric element 160, vibration occurs in a direction perpendicular to the piezoelectric layer 164, thereby emitting sound waves. Accordingly, the piezoelectric element 160 can function as a speaker.

In addition, the piezoelectric layer 164 of the piezoelectric element 160 is stretched along the first direction and includes dichroic dyes such as iodine. Therefore, the piezoelectric element 160 can function as a polarizer, and this will be described in detail with reference to FIG. 3.

Figure 3:
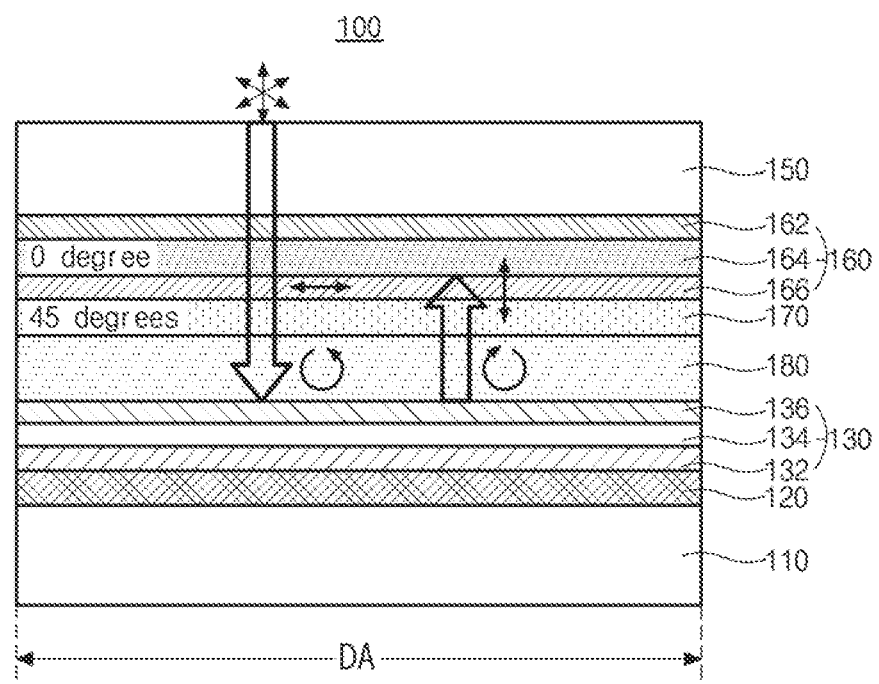
FIG. 3 is a view showing polarization states of external light incident on the display device according to the first embodiment of the present disclosure.

FIG. 3 is a view schematically showing polarization states of external light incident on the display device according to the first embodiment of the present disclosure.

As shown in FIG. 3, in the display device 100 according to the first embodiment of the present disclosure, the piezoelectric layer 164 of the piezoelectric element 160 has a transmission axis of 0 degree, and the phase retardation film 170 has an optical axis of 45 degrees.

Here, the piezoelectric layer 164 is stretched along the first direction and has the transmission axis of a second direction perpendicular to the first direction. Accordingly, the second direction is 0 degree, the first direction is 90 degrees, and the optical axis of the phase retardation film 170 forms 45 degrees with respect to the first and second directions.

The external light incident on the display device 100 according to the first embodiment of the present disclosure passes through the second substrate 150 as it is and passes through the piezoelectric layer 164 of the piezoelectric element 160, so that linearly polarized light vibrating in the second direction (0 degree) is transmitted. Then, light vibrating in the second direction (0 degree) passes through the phase retardation film 170 and is changed into left-circularly polarized light.

Next, the left-circularly polarized light is reflected by the light-emitting diode 130 or an electrode of the driving element layer 120 and is changed into right-circularly polarized light, and the right-circularly polarized light passes through the phase retardation film 170 again and is changed into linearly polarized light vibrating in the first direction (90 degrees). The linearly polarized light vibrating in the first direction (90 degrees) is perpendicular to the transmission axis (0 degree) of the piezoelectric layer 164, and thus the linearly polarized light is blocked by the piezoelectric layer 164 and is not output to the outside.

Accordingly, the display device 100 according to the first embodiment of the present disclosure can block reflection of the external light.

As described above, since the display device 100 according to the first embodiment of the present disclosure includes the piezoelectric element 160 functioning as a speaker and a polarizer, a separate speaker and a separate polarizer can be omitted, and manufacturing costs can be reduced. In addition, it is possible to implement the display device 100 with a light weight, slim thickness and compact size.

Further, since the sound directly output from the piezoelectric element 160 can be heard, sound quality can be improved.

Meanwhile, recently, a transparent display device using an electroluminescent display device has been widely developed. The transparent display device is a display in which a background of a screen is visible and has an advantage of showing both image information and surrounding environment information. A transparent display device according to an embodiment of the present disclosure will be described in detail with reference to accompanying drawings.

Second Embodiment

Figure 4:
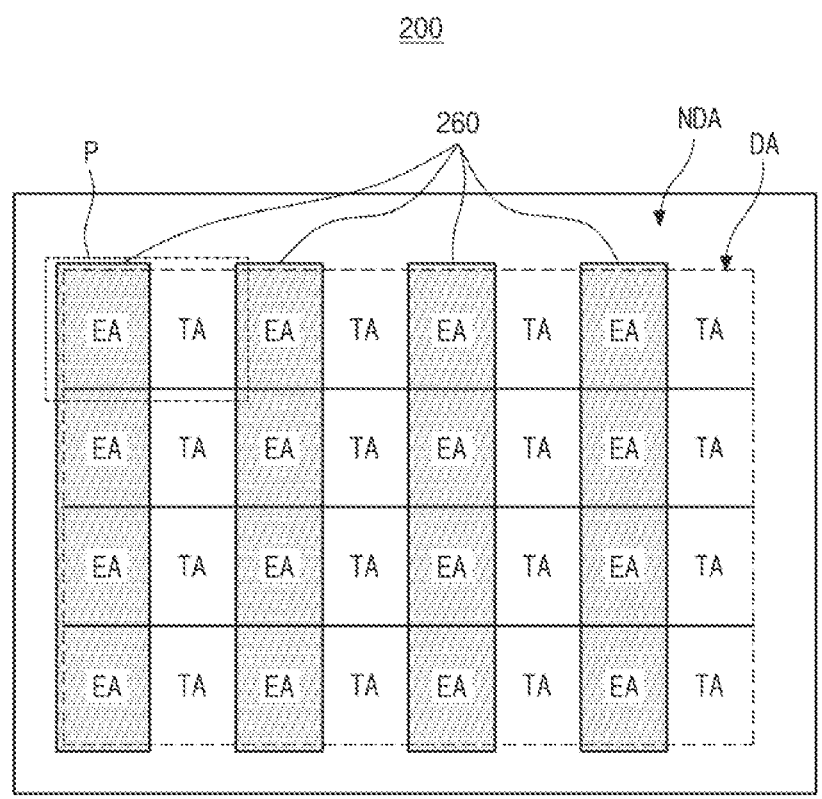
FIG. 4 is a plan view of a display device according to a second embodiment of the present disclosure.

FIG. 4 is a schematic plan view of a display device according to a second embodiment of the present disclosure and shows a transparent display device using an electroluminescent display device.

In FIG. 4, a display device 200 according to the second embodiment of the present disclosure includes a display area DA displaying an image and a non-display area NDA surrounding the display area DA.

The display area DA includes emission areas EA and transparent areas TA. More particularly, a plurality of pixels P are arranged in a matrix form in the display area DA, and each pixel P includes an emission area EA and a transparent area TA.

A light-emitting diode is formed in the emission area EA of each pixel P. In addition, at least one transistor and at least one capacitor can be further formed in the emission area EA of each pixel P.

A pad portion and a link portion are provided in the non-display area NDA in order to apply signals to the plurality of pixels P of the display area DA. The pad portion is connected to an outer driving circuit and the link portion connects the pad portion with lines of the display area DA.

Meanwhile, the display device 200 according to the second embodiment of the present disclosure includes piezoelectric elements 260. The piezoelectric elements 260 are formed to correspond to the emission areas EA of the display area DA and are not formed in the transparent areas TA. At this time, the piezoelectric elements 260 can be connected to each other to correspond to the emission areas EA of the pixels P arranged along a vertical direction in the figure and can be formed as one body. The piezoelectric elements 260 can be spaced apart from each other to correspond to the emission areas EA of the pixels P arranged along a horizontal direction in the figure.

The piezoelectric element 260 includes a first electrode, a second electrode and a piezoelectric layer therebetween. The first and second electrodes can be connected to the outer driving circuit in the non-display area NDA.

The piezoelectric element 260 functions as a speaker and a polarizer.

Figure 5:
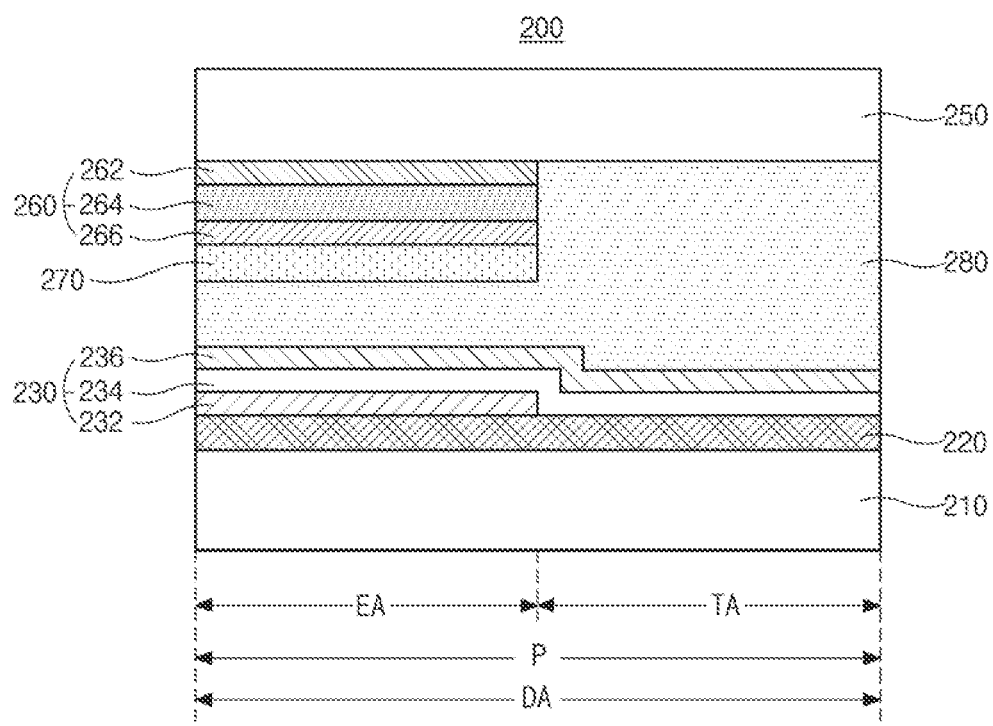
FIG. 5 is a cross-sectional view of the display device according to the second embodiment of the present disclosure.

FIG. 5 is a schematic cross-sectional view of the display device according to the second embodiment of the present disclosure and shows a cross-section corresponding to one pixel P of the display area DA of FIG. 4.

In FIG. 5, the display device 200 according to the second embodiment of the present disclosure includes a first substrate 210, a second substrate 250, a driving element layer 220, a light-emitting diode 230, a piezoelectric element 260, a phase retardation film 270 and a filling layer 280.

Here, a display area DA and a non-display area NDA are defined at the first substrate 210 and the second substrate 250. The pixel P of the display area DA includes an emission area EA and a transparent area TA, and the light-emitting diode 230, the piezoelectric element 260 and the phase retardation film 270 are disposed in the emission area EA.

More specifically, the first substrate 210 and the second substrate 250 can be a glass substrate or a plastic substrate. For example, polyimide (PI) or polycarbonate (PC) can be used for the plastic substrate, but is not limited thereto.

The driving element layer 220 can be formed in the display area DA on an inner surface of the first substrate 210. The driving element layer 220 is formed by stacking a plurality of patterns and a plurality of insulation layers. The driving element layer 220 can include a plurality of lines and elements. For example, the driving element layer 220 can include at least one thin film transistor and at least one capacitor, which are formed at each pixel P.

An anode electrode 232 is formed at each pixel P on the driving element layer 220. The anode electrode 232 is disposed in the emission area EA of each pixel P.

The anode electrode 232 is formed of a conductive material having relatively high work function. For example, the anode electrode 232 can be formed of a transparent conductive material such as indium tin oxide (ITO) or indium zinc oxide (IZO), but is not limited thereto.

Meanwhile, the display device 200 according to the second embodiment of the present disclosure can be a top emission type in which light of the light-emitting diode 230 is output toward a direction opposite the first substrate 210, that is, output to the outside through the second substrate 250. Accordingly, the anode electrode 232 can further include a reflective electrode or a reflective layer, which is formed of a metal material having relatively high reflectance, under the transparent conductive material layer. For example, the reflective electrode or the reflective layer can be formed of aluminum-palladium-copper (APC) alloy, silver (Ag) or aluminum (Al). At this time, the anode electrode 232 can have a triple-layered structure of ITO/APC/ITO, ITO/Ag/ITO or ITO/Al/ITO, but is not limited thereto.

A light-emitting layer 234 is formed on the anode electrode 232. The light-emitting layer 234 can be disposed in both the emission area EA and the transparent area TA.

The light-emitting layer 234 can include a first charge auxiliary layer, a light-emitting material layer and a second charge auxiliary layer sequentially disposed on the anode electrode 232. The light-emitting material layer can be formed of a white luminescent material. Alternatively, the light-emitting material layer can be formed of any one of red, green and blue luminescent materials or can include all the red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto, and other variations are possible.

A cathode electrode 236 of a conductive material having a relatively low work function is formed on the light-emitting layer 234. The cathode electrode 236 can be disposed in both the emission area EA and the transparent area TA.

For example, the cathode electrode 236 can be formed of aluminum (Al), magnesium (Mg), silver (Ag), or an alloy thereof. The cathode electrode 236 can have a relatively thin thickness such that light from the light-emitting layer 234 can be transmitted therethrough. Alternatively, the cathode electrode 236 can be formed of a transparent conductive material such as indium-gallium-oxide (IGO), but is not limited thereto.

The anode electrode 232, the light-emitting layer 234 and the cathode electrode 236 constitute the light-emitting diode 230.

Next, a first electrode 262, a piezoelectric layer 264 and a second electrode 266 are sequentially formed in the display area DA on an inner surface of the second substrate 250. The first electrode 262, the piezoelectric layer 264 and the second electrode 266 constitute the piezoelectric element 260. The piezoelectric element 260 is disposed only in the emission area EA of each pixel P and is not disposed in the transparent area TA.

The first electrode 262 and the second electrode 266 are formed of a transparent conductive material. For example, the first electrode 262 and the second electrode 266 can be formed of indium tin oxide (ITO), indium zinc oxide (IZO), metal oxide, silver nanowire or carbon nanotube, but is not limited thereto. Here, the first electrode 262 and the second electrode 266 can be formed of the same material. Alternatively, the first electrode 262 and the second electrode 266 can be formed of different materials.

The piezoelectric layer 264 between the first electrode 262 and the second electrode 266 is formed of a piezoelectric polymer in which mechanical deformation is generated by an electrical signal. Thus, when a voltage is applied to the first and second electrodes 262 and 266, the piezoelectric layer 264 is contracted or expanded. The piezoelectric polymer can be a cellulose-based electro-active polymer or polyvinylidene fluoride.

Here, the cellulose-based electro-active polymer can have a structure expressed by the above chemical formula 1.

The piezoelectric layer 264 is stretched along a first direction. Therefore, molecules of the piezoelectric layer 264 are arranged in the first direction, and the piezoelectric effect is maximized.

Here, the piezoelectric layer 264 can be mechanically stretched. Alternatively, the piezoelectric layer 264 can be chemically stretched using corona discharge or a magnetic field.

Meanwhile, the piezoelectric layer 264 can include dichroic dyes. Here, the dichroic dyes can be iodine. The dichroic dyes can be arranged along the stretching direction of the piezoelectric layer 264, that is, the first direction.

The piezoelectric layer 264 including the dichroic dyes has a polarizing function. At this time, as the content of the dichroic dyes increases, the optical properties decrease. Thus, the dichroic dyes are beneficially contained such that the degree of polarization of the piezoelectric layer 264 is 90% to 99% and the transmittance including the surface reflectance is 40% to 45%. For example, the content of the dichroic dyes can be 2 to 30 parts by weight based on 100 parts by weight of the piezoelectric polymer forming the piezoelectric layer 264, preferably 5 to 20 parts by weight, and more preferably 6 to 15 parts by weight. However, the content of the dichroic dyes in the present disclosure is not limited thereto as long as the degree of polarization and the transmittance are satisfied.

The phase retardation film 270 is formed on the second electrode 266. The phase retardation film 270 is disposed only in the emission area EA of each pixel P and is not disposed in the transparent area TA.

The phase retardation film 270 can be a quarter wave plate (QWP) having a phase retardation value of $\lambda/4$ and changing a polarization state of light. The phase retardation film 270 changes incident linearly polarized light into circularly polarized light and changes incident circularly polarized light into linearly polarized light. An optical axis of the phase retardation film 270 forms 45 degrees with respect to the stretching direction of the piezoelectric layer 264, that is, the first direction.

The phase retardation film 270 can be formed by coating and polymerizing a reactive mesogen. In this case, an alignment layer can be further formed to arrange the reactive mesogen. Alternatively, the phase retardation film 270 can be formed of polycarbonate, tri-acetyl cellulose (TAC), acryl, or polyethylene terephthalate (PET), but is not limited thereto.

Next, the filling layer 280 is formed between the first substrate 210 and the second substrate 250. Namely, the filling layer 280 is disposed between the light-emitting diode 230 of the first substrate 210 and the phase retardation film 270 of the second substrate 250. The filling layer 280 can be formed of a photocurable or thermosetting material.

Further, a seal pattern surrounding the display area DA is formed in the non-display area NDA of FIG. 4 between the first substrate 210 and the second substrate 250. The seal pattern can be a dam structure, and the filling layer 280 can be disposed inside the seal pattern.

As described above, the display device 200 according to the second embodiment of the present disclosure includes the emission area EA and the transparent area TA and shows the surrounding environment information such as the background through the transparent area TA while displaying the image information through the emission area EA.

Meanwhile, the display device 200 according to the second embodiment of the present disclosure includes the piezoelectric element 260 in the display area DA. When an electrical signal is applied to the first and second electrodes 262 and 266 of the piezoelectric element 260, vibration occurs in a direction perpendicular to the piezoelectric layer 264, thereby emitting sound waves. Accordingly, the piezoelectric element 260 can function as a speaker.

In addition, the piezoelectric layer 264 of the piezoelectric element 260 is stretched along the first direction and includes dichroic dyes such as iodine. Therefore, the piezoelectric element 260 can function as a polarizer.

The piezoelectric element 260 is formed only in the emission areas EA. Accordingly, the first and second electrodes 262 and 266 and the piezoelectric layer 264 of the piezoelectric element 260 are disposed only in the emission area EA and are not disposed in the transparent area TA. However, the first electrode 262 of the piezoelectric element 260 can be also formed in the transparent area TA.

Third Embodiment

Figure 6:
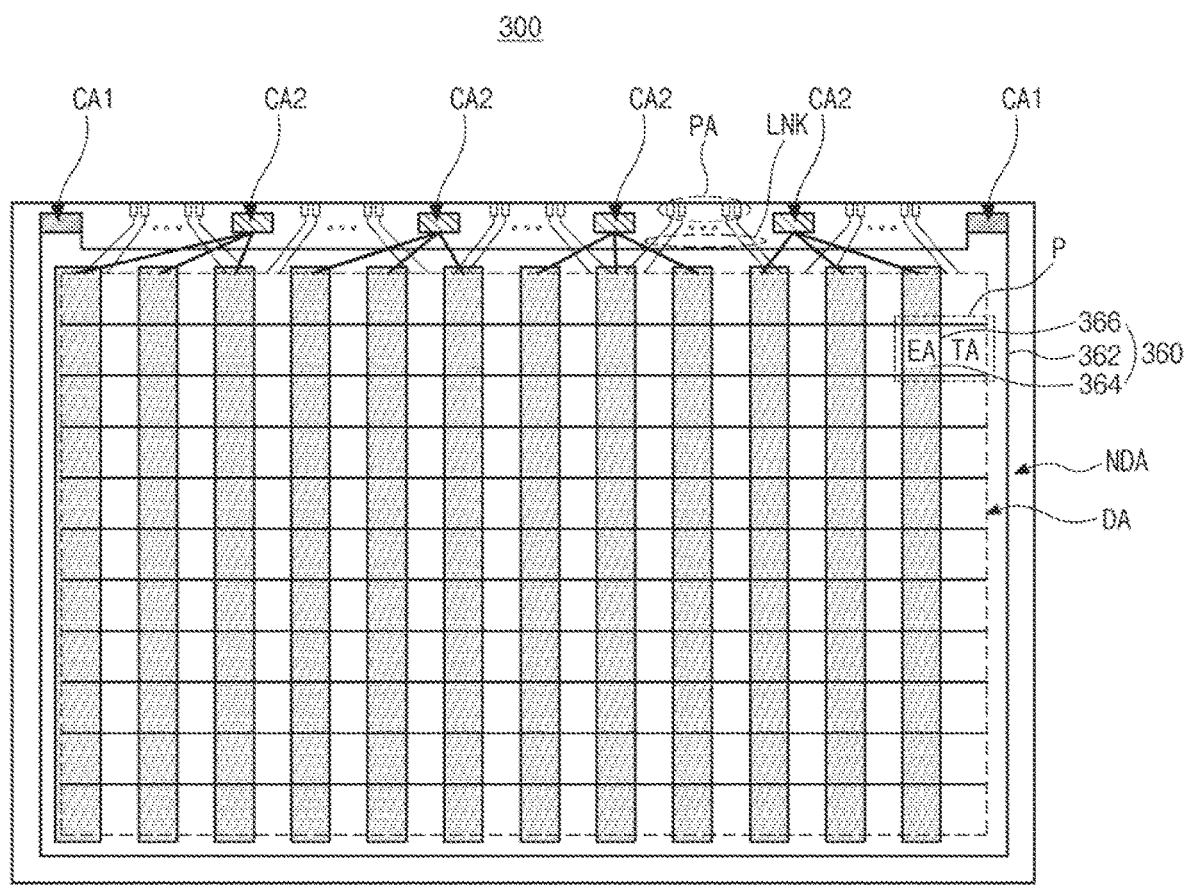
FIG. 6 is a plan view of a display device according to a third embodiment of the present disclosure.

FIG. 6 is a schematic plan view of a display device according to a third embodiment of the present disclosure and shows a transparent display device using an electroluminescent display device.

In FIG. 6, a display device 300 according to the third embodiment of the present disclosure includes a display area DA displaying an image and a non-display area NDA surrounding the display area DA.

The display area DA includes emission areas EA and transparent areas TA. More particularly, a plurality of pixels P are arranged in a matrix form in the display area DA, and each pixel P includes an emission area EA and a transparent area TA.

Further, a light-emitting diode is formed in the emission area EA of each pixel P. In addition, at least one transistor and at least one capacitor can be further formed in the emission area EA of each pixel P.

The display device 300 according to the third embodiment of the present disclosure includes piezoelectric elements 360. The piezoelectric elements 360 are formed to correspond to the emission areas EA of the display area DA and are not formed in the transparent areas TA. At this time, the piezoelectric elements 360 can be connected to each other to correspond to the emission areas EA of the pixels P arranged along a vertical direction in the figure and can be formed as one body. The piezoelectric elements 360 can be spaced apart from each other to correspond to the emission areas EA of the pixels P arranged along a horizontal direction in the figure.

Each piezoelectric element 360 includes a first electrode 362, a piezoelectric layer 364 and a second electrode 366. At this time, the first electrode 362 is formed substantially all over the display area DA, and the piezoelectric layer 364 and the second electrode 366 are formed only in the emission area EA.

The piezoelectric element 360 functions as a speaker and a polarizer.

In addition, a pad portion PA and a link portion LNK are provided in the non-display area NDA in order to apply signals to the plurality of pixels P of the display area DA. The pad portion PA is connected to an outer driving circuit and the link portion LNK connects the pad portion PA with lines of the display area DA. Here, each of the pad portion PA and the link portion LNK is divided into a plurality of groups, and one group can be connected to one driving circuit.

Meanwhile, a first contact portion CA1 can be disposed at a corner of the non-display area NDA. The first electrode 362 of the piezoelectric element 360 can be connected to the driving circuit through the first contact portion CA1 to thereby receive a signal.

Further, a second contact portion CA2 can be disposed between adjacent two groups of the link portions LNK in the non-display area NDA. The second electrode 366 of the piezoelectric element 360 can be connected to the driving circuit through the second contact portion CA2 to thereby receive a signal. At this time, one second contact portion CA2 can be a plurality of second electrode 366. However, the connection between the second contact portion CA2 and the second electrode 366 is not limited thereto.

Figure 7:
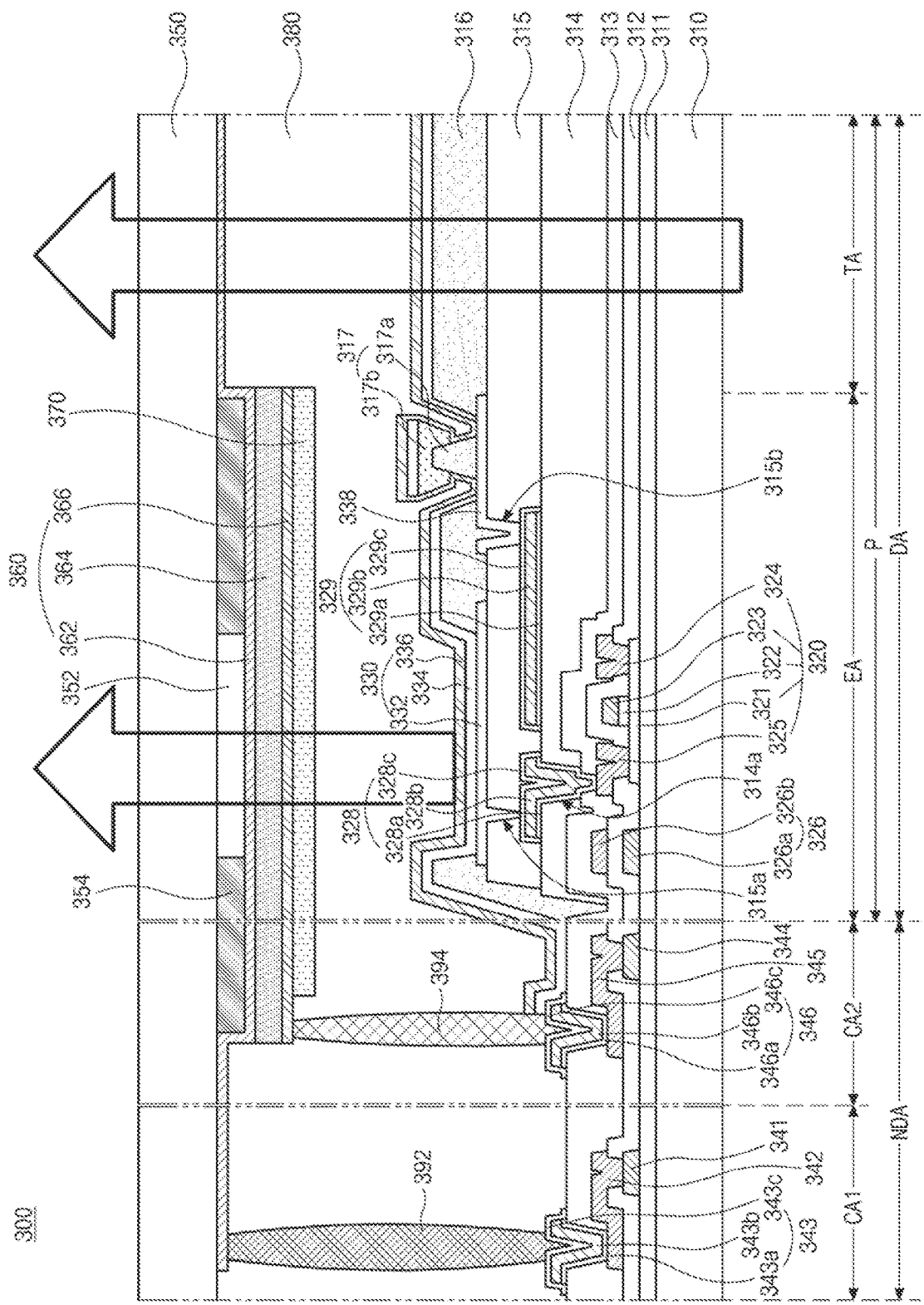
FIG. 7 is a cross-sectional view of the display device according to the third embodiment of the present disclosure.

FIG. 7 is a schematic cross-sectional view of the display device according to the third embodiment of the present disclosure and shows a cross-section corresponding to one pixel P of the display area DA and the first and second contact portions CA1 and CA2 of the non-display area NDA of FIG. 6.

In FIG. 7, the display device 300 according to the third embodiment of the present disclosure includes a first substrate 310 and a second substrate 350, and a display area DA and a non-display area NDA are defined at the first and second substrates 310 and 350. A pixel P of the display area DA includes an emission area EA and a transparent area TA, and the non-display area NDA includes a first contact portion CA1 and a second contact portion CA2.

A thin film transistor 320, a storage capacitor 326 and a light-emitting diode 330 are disposed on the first substrate 310, that is, in the emission area EA of the display area DA on an inner surface of the first substrate 310.

Here, the thin film transistor 320 can include a semiconductor layer 321, a gate electrode 323, a source electrode 324, and a drain electrode 325. The storage capacitor 326 can include first and second capacitor electrodes 326a and 326b. The light-emitting diode 330 can include an anode electrode 332, a light-emitting layer 334, and a cathode electrode 336.

A first pad electrode 341, a first connection electrode 342 and a first pad terminal 343 can be disposed in the first contact portion CA1 of the non-display area NDA on the inner surface of the first substrate 310, and a second pad electrode 344, a second connection electrode 345 and a second pad terminal 346 can be disposed in the second contact portion CA2.

In addition, a color filter layer 352, a black matrix 354, a piezoelectric element 360, and a phase retardation film 370 are disposed under the second substrate 350, that is, disposed in the display area DA on an inner surface of the second substrate 350. The piezoelectric element 360 can include a first electrode 362, a piezoelectric layer 364 and a second electrode 366.

More particularly, a buffer layer 311 is formed of an insulating material substantially all over the first substrate 310. Thus, the buffer layer 311 is disposed in both the display area DA and the non-display area NDA.

The first substrate 310 can be a glass substrate or a plastic substrate. For example, polyimide (PI) or polycarbonate (PC) can be used for the plastic substrate, but is not limited thereto.

The buffer layer 311 can be formed of an inorganic insulating material such as silicon oxide ($SiO_2$) or silicon nitride (SiNx). The buffer layer 311 can have a single-layered structure. Alternatively, the buffer layer 311 can have a multiple-layered structure, and in this case, different material can be alternately stacked.

The semiconductor layer 321 is patterned and formed in the emission area EA of the display area DA on the buffer layer 311. The semiconductor layer 321 can be formed of an oxide semiconductor material. In this case, a light-blocking pattern can be further formed under the semiconductor layer 321, and the light-blocking pattern blocks light incident on the semiconductor layer 321 to prevent the semiconductor layer 321 from being degraded by light. Alternatively, the semiconductor layer 321 can be formed of polycrystalline silicon, and in this case, both ends of the semiconductor layer 321 can be doped with impurities.

A gate insulation layer 322 and a gate electrode 323 are sequentially formed on the semiconductor layer 321 to correspond to a center of the semiconductor layer 321.

The gate insulation layer 322 can be formed of an inorganic insulating material such as silicon oxide ($SiO_2$) or silicon nitride (SiNx). When the semiconductor layer 321 is formed of an oxide semiconductor material, the gate insulation layer 322 can be formed of silicon oxide ($SiO_2$). Alternatively, when the semiconductor layer 321 is formed of polycrystalline silicon, the gate insulation layer 322 can be formed of silicon oxide ($SiO_2$) or silicon nitride (SiNx).

The gate electrode 323 is formed of a conductive material such as metal. The gate electrode 323 can be formed of at least one of aluminum (Al), copper (Cu), molybdenum (Mo), titanium (Ti), chromium (Cr), nickel (Ni), tungsten (W), platinum (Pt), palladium (Pd), silver (Ag), magnesium (Mg), gold (Au), neodymium (Nd), iridium (Ir), lithium (Li), calcium (Ca) and their alloys and can have a single-layered structure or a multiple-layered structure. For example, the gate electrode 323 can have a double-layered structure of a lower layer and an upper layer, and the upper layer can be formed of a material having lower resistivity than the lower layer. At this time, a thickness of the upper layer can be thicker than a thickness of the lower layer. The gate electrode 323 having a double-layered structure can include a lower layer of molybdenum-titanium (MoTi) alloy and an upper layer of copper (Cu), but is not limited thereto.

As shown in the figure, the gate insulation layer 322 can be patterned to have the same shape as the gate electrode 323. Alternatively, the gate insulation layer 322 may not be patterned and can be formed substantially all over the first substrate 310.

Meanwhile, a gate line can be formed of the same material and on the same layer as the gate electrode 323.

A first capacitor electrode 326a is formed in the emission area EA on the buffer layer 311. The first capacitor electrode 326a can be formed of the same material and through the same process as the gate electrode 323.

An interlayer insulation layer 312 of an insulating material is formed on the gate electrode 323 and the first capacitor electrode 326a substantially all over the first substrate 310. Accordingly, the interlayer insulation layer 312 is disposed in both the display area DA and the non-display area NDA.

The interlayer insulation layer 312 can be formed of an inorganic insulating material such as silicon oxide ($SiO_2$) or silicon nitride (SiNx). The interlayer insulation layer 312 has contact holes exposing top surfaces of the both ends of the semiconductor layer 321. It is illustrated that the interlayer insulation layer 312 has a single-layered structure, and the present disclosure is not limited thereto. Alternatively, the interlayer insulation layer 312 can have a multiple-layered structure.

Source and drain electrodes 324 and 325 of a conductive material such as metal are formed on the interlayer insulation layer 312. The source and drain electrodes 324 and 325 are spaced apart from each other with the gate electrode 323 disposed therebetween. The source and drain electrodes 324 and 325 contact the both ends of the semiconductor layer 321 through the contact holes formed in the interlayer insulation layer 312, respectively.

The source and drain electrodes 324 and 325 can be formed of at least one of aluminum (Al), copper (Cu), molybdenum (Mo), titanium (Ti), chromium (Cr), nickel (Ni), tungsten (W), platinum (Pt), palladium (Pd), silver (Ag), magnesium (Mg), gold (Au), neodymium (Nd), iridium (Ir), lithium (Li), calcium (Ca) and their alloys and can have a single-layered structure or a multiple-layered structure. For example, the source and drain electrodes 324 and 325 can have a double-layered structure of a lower layer and an upper layer, and the upper layer can be formed of a material having lower resistivity than the lower layer. At this time, a thickness of the upper layer can be thicker than a thickness of the lower layer. The source and drain electrodes 324 and 325 having a double-layered structure can include a lower layer of molybdenum-titanium (MoTi) alloy and an upper layer of copper (Cu), but is not limited thereto. Alternatively, the source and drain electrodes 324 and 325 can be formed of aluminum or an aluminum alloy and can have a triple-layered structure of titanium/aluminum/titanium.

The semiconductor layer 321, the gate electrode 323, and the source and drain electrodes 324 and 325 constitute the thin film transistor 320. Here, the thin film transistor 320 can have a coplanar structure in which the gate electrode 323 and the source and drain electrodes 324 and 325 are disposed at one side of the semiconductor layer 321, that is, over the semiconductor layer 321.

Alternatively, the thin film transistor 320 can have an inverted staggered structure in which the gate electrode is disposed under the semiconductor layer and the source and drain electrodes are disposed over the semiconductor layer. In this case, the semiconductor layer can be formed of an oxide semiconductor material or amorphous silicon.

The thin film transistor 320 corresponds to a driving thin film transistor, and a switching thin film transistor having the same structure as the driving thin film transistor 320 can be further formed in the emission area EA of each pixel P. The gate electrode 323 of the driving thin film transistor 320 can be connected to a drain electrode of the switching thin film transistor, and the source electrode 324 of the driving thin film transistor 320 can be connected to a power line. In addition, a gate electrode and a source electrode of the switching thin film transistor can be connected to the gate line and the data line, respectively.

Further, one or more sensing thin film transistors having the same structure as the driving thin film transistor 320 can be further formed in the emission area EA of each pixel P, but is not limited thereto.

A second capacitor electrode 326b is formed in the emission area EA on the interlayer insulation layer 312. The second capacitor electrode 326b overlaps the first capacitor electrode 326a. The first and second capacitor electrodes 326a and 326b form the storage capacitor 326 with the interlayer insulation layer 312 therebetween.

The second capacitor electrode 326b can be formed of the same material and through the same process as the source and drain electrodes 324 and 325.

A passivation layer 313 of an insulating material is formed on the source and drain electrodes 324 and 325 and the second capacitor electrode 326b substantially all over the first substrate 310. Therefore, the passivation layer 313 is disposed in both the display area DA and the non-display area NDA. The passivation layer 313 can be formed of an inorganic insulating material such as silicon oxide (SiO$_2$) or silicon nitride (SiNx).

A first overcoat layer 314 of an insulating material is formed on the passivation layer 313 substantially all over the display area DA. That is, the first overcoat layer 314 can be removed in the non-display area NDA. However, the present disclosure is not limited thereto. Alternatively, the first overcoat layer 314 can be formed in the non-display area NDA.

The first overcoat layer 314 can have a flat top surface. The first overcoat layer 314 can be formed of an organic insulating material such as photo acryl or benzocyclobutene. Alternatively, the first overcoat layer 314 can be formed of one or more of an acrylic resin, an epoxy resin, a phenol resin, a polyamide resin, a polyimide resin, an unsaturated polyester resin, a polyphenylene resin and a polyphenylene sulfide resin, but is not limited thereto.

The first overcoat layer 314 has a drain contact hole 314a partially exposing the drain electrode 325. The drain contact hole 314a is also formed in the passivation layer 313 under the first overcoat layer 314.

An auxiliary drain electrode 328 and a first auxiliary electrode 329 of a conductive material such as metal are formed in the emission area EA of the display area DA on the first overcoat layer 314. The auxiliary drain electrode 328 contacts the drain electrode 325 through the drain contact hole 314a. The first auxiliary electrode 329 is spaced apart from the auxiliary drain electrode 328.

The auxiliary drain electrode 328 and the first auxiliary electrode 329 can be formed of at least one of aluminum (Al), copper (Cu), molybdenum (Mo), titanium (Ti), chromium (Cr), nickel (Ni), tungsten (W), platinum (Pt), palladium (Pd), silver (Ag), magnesium (Mg), gold (Au), neodymium (Nd), iridium (Ir), lithium (Li), calcium (Ca) and their alloys.

Each of the auxiliary drain electrode 328 and the first auxiliary electrode 329 can have a triple-layered structure including a first layer 328a and 329a, a second layer 328b and 329b, and a third layer 328c and 329c.

Here, the second layer 328b and 329b can be formed of a different material from the first layer 328a and 329a and the third layer 328c and 329c, and the first layer 328a and 329a and the third layer 328c and 329c can be formed of the same material. The material of the second layer 328b and 329b can have lower resistivity than the materials of the first layer 328a and 329a and the third layer 328c and 329c. For example, the second layer 328b and 329b can be formed of aluminum or an aluminum alloy, and the first layer 328a and 329a and the third layer 328c and 329c can be formed of titanium or a titanium alloy.

At this time, a thickness of the second layer 328b and 329b can be thicker than a thickness of each of the first layer 328a and 329a and the third layer 328c and 329c, and the thickness of the first layer 328a and 329a and the thickness of the third layer 328c and 329c can be the same. In addition, the thickness of the second layer 328b and 329b can be thicker than a sum of the thicknesses of the first layer 328a and 329a and the third layer 328c and 329c.

Meanwhile, the third layer 328c and 329c can cover and contact side surfaces of the first layer 328a and 329a and the second layer 328b and 329b. Therefore, the second layer 328b and 329b can be surrounded by the first layer 328a and 329a and the third layer 328c and 329c, thereby preventing the second layer 328b and 329b from being corroded.

However, the present disclosure is not limited thereto. In another embodiment, the auxiliary drain electrode 328 and the first auxiliary electrode 329 can have a single-layered or a double-layered structure.

A second overcoat layer 315 of an insulating material is formed on the auxiliary drain electrode 328 and the first auxiliary electrode 329 substantially all over the display area DA. That is, the second overcoat layer 315 can be removed in the non-display area NDA. However, the present disclosure is not limited thereto. Alternatively, the second overcoat layer 315 can be formed in the non-display area NDA.

The second overcoat layer 315 can have a flat top surface. The second overcoat layer 315 can be formed of an organic insulating material such as photo acryl or benzocyclobutene. Alternatively, the second overcoat layer 315 can be formed of one or more of an acrylic resin, an epoxy resin, a phenol resin, a polyamide resin, a polyimide resin, an unsaturated polyester resin, a polyphenylene resin and a polyphenylene sulfide resin, but is not limited thereto. Here, the first and second overcoat layers 314 and 315 can be formed of the same material or can be formed of different materials.

The second overcoat layer 315 has first and second contact holes 315a and 315b exposing the auxiliary drain electrode 328 and the first auxiliary electrode 329, respectively. As shown in the figure, the first contact hole 315a can be spaced apart from the drain contact hole 314a. Alternatively, the first contact hole 315a can be directly over the drain contact hole 314a and can overlap the drain contact hole 314a.

An anode electrode 332 of a conductive material having relatively high work function is formed in the emission area EA of the display area DA on the second overcoat layer 315. The anode electrode 332 contacts the auxiliary drain electrode 328 through the first contact hole 315a. Accordingly, the anode electrode 332 is electrically connected to the drain electrode 325 through the auxiliary drain electrode 328.

For example, the anode electrode 332 can be formed of a transparent conductive material such as indium tin oxide (ITO) or indium zinc oxide (IZO), but is not limited thereto.

Meanwhile, the display device 300 according to the third embodiment of the present disclosure can be a top emission type in which light of the light-emitting diode 330 is output toward a direction opposite the first substrate 310, that is, output to the outside through the second substrate 350. Accordingly, the anode electrode 332 can further include a reflective electrode or a reflective layer, which is formed of a metal material having relatively high reflectance, under the transparent conductive material layer. For example, the reflective electrode or the reflective layer can be formed of aluminum-palladium-copper (APC) alloy, silver (Ag) or aluminum (Al). At this time, the anode electrode 332 can have a triple-layered structure of ITO/APC/ITO, ITO/Ag/ITO or ITO/Al/ITO, but is not limited thereto.

In addition, a second auxiliary electrode 338 is formed in the emission area EA of the display area DA on the second overcoat layer 315. The second auxiliary electrode 338 is formed of the same material and through the same process as the anode electrode 332 and contacts the first auxiliary electrode 329 through the second contact hole 315b.

A bank 316 of an insulating material is formed on the anode electrode 332 and the second auxiliary electrode 338 substantially all over the display area DA. The bank 316 overlaps edges of the anode electrode 332, covers the edges of the anode electrode 332, and exposes a central portion of the anode electrode 332. Further, the bank 316 covers the second auxiliary electrode 338 and partially exposes the second auxiliary electrode 338.

The bank 316 can be formed of an organic insulating material such as polyimide or hexamethyldisiloxane (HMDSO). Alternatively, the bank 316 can be formed of an acrylic resin or benzocyclobutene, but is not limited thereto.

At this time, the first contact hole 315a can be spaced apart from the bank 316, and the second contact hole 315b can overlap the bank 316 and can be disposed under the bank 316. Alternatively, the first and second contact holes 315a and 315b can overlap the bank 316 and can be disposed under the bank 316.

A partition wall 317 is formed on the second auxiliary electrode 338 exposed by the bank 316. The partition wall 317 is spaced apart from the bank 316, and thus the second auxiliary electrode 338 is exposed between the bank 316 and the partition wall 317.

The partition wall 317 includes a first pattern 317a and a second pattern 317b. Here, the second pattern 317b is disposed on the first pattern 317a, and the second pattern 317b covers a top surface and part of side surfaces of the first pattern 317a.

The side surfaces of the first pattern 317a and the second pattern 317b have different inclinations. Namely, the first pattern 317a has a positive slope, and the second pattern 317b has a reverse slope. Accordingly, the top surface of the first pattern 317a has a narrower width than a bottom surface of the first pattern 317a, and a top surface of the second pattern 317b has a wider width than a bottom surface of the second pattern 317b. At this time, the top surface of the second pattern 317b can have a wider width than the bottom surface of the first pattern 317a.

The first pattern 317a can be formed of the same material and through the same process as the bank 316. In addition, the second pattern 317b can be formed of the same material as the bank 316 through a different process from the bank 316. Alternatively, the second pattern 317b can be formed of a different material from the bank 316.

Next, a light-emitting layer 334 is formed on the anode electrode 332 exposed by the bank 316. The light-emitting layer 334 can be formed substantially all over the display area DA. Therefore, the light-emitting layer 334 can be disposed in the emission area EA and the transparent area TA. In addition, the light-emitting layer 334 can be partially formed in the second contact portion CA2 of the non-display area NDA.

The light-emitting layer 334 is separated by the partition wall 317. That is, the light-emitting layer 334 on the anode electrode 332 and the bank 316 may not be connected to and can be separated from the light-emitting layer 334 on the partition wall 317. Accordingly, the light-emitting layer 334 can expose the second auxiliary electrode 338 between the bank 316 and the partition wall 317.

The light-emitting layer 334 can include a first charge auxiliary layer, a light-emitting material layer and a second charge auxiliary layer sequentially disposed on the anode electrode 332. The light-emitting material layer can be formed of a white luminescent material. Alternatively, the light-emitting material layer can be formed of any one of red, green and blue luminescent materials or can include all the red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto, and other variations are possible.

The light-emitting layer 334 can be formed through a thermal evaporation process using a fine metal mask. Alternatively, the light-emitting layer 334 can be formed through a solution process. In this case, at least a top surface of the bank 316 can have a hydrophobic property, and the partition wall 317 can be omitted. However, the present disclosure is not limited thereto.

A cathode electrode 336 of a conductive material having a relatively low work function is formed on the light-emitting layer 334 substantially all over the display area DA. Accordingly, the cathode electrode 336 can be disposed in the emission area EA and the transparent area TA. In addition, the cathode electrode 336 can be partially formed in the second contact portion CA2 of the non-display area NDA.

The cathode electrode 336 is formed on the top surfaces and the side surfaces of the bank 316 and the partition wall 317 and contacts the second auxiliary electrode 338 exposed between the bank 316 and the partition wall 317. Therefore, the cathode electrode 336 is electrically connected to the first auxiliary electrode 329 through the second auxiliary electrode 338.

Here, the cathode electrode 336 can be formed of aluminum (Al), magnesium (Mg), silver (Ag), or an alloy thereof. At this time, the cathode electrode 336 can have a relatively thin thickness such that light from the light-emitting layer 334 can be transmitted therethrough. Alternatively, the cathode electrode 336 can be formed of a transparent conductive material such as indium-gallium-oxide (IGO), but is not limited thereto.

The anode electrode 332, the light-emitting layer 334 and the cathode electrode 336 constitute the light-emitting diode 330.

As described above, the display device 300 according to the third embodiment of the present disclosure can be a top emission type in which light of the light-emitting layer 334 of the light-emitting diode 330 is output toward a direction opposite the first substrate 310, that is, is output to the outside through the cathode electrode 336. The top emission type display device can have a wider emission area than a bottom emission type display panel of the same size, to thereby improve luminance and reduce power consumption.

At this time, the light-emitting diode 330 of the emission area EA of each pixel P can have an element thickness for a micro-cavity effect corresponding to a wavelength of the emitted light, thereby increasing the light efficiency. Here, the element thickness can be defined as a distance between the anode electrode 332 and the cathode electrode 336, but is not limited thereto.

Next, an encapsulation portion is formed on the cathode electrode 336 substantially all over the first substrate 310. The encapsulation portion covers the light-emitting diode 330 and blocks moisture or oxygen introduced from the outside, thereby protecting the light-emitting diode 330. The encapsulation portion can have a structure in which inorganic layers and organic layers alternately stacked.

Like this, in the display device 300 according to the third embodiment of the present disclosure, the thin film transistor 320, the storage capacitor 326, and the light-emitting diode 330 are formed in the emission area EA of the display area DA, and the insulation layers 311, 312, 313, 314, 315 and 316, the light-emitting layer 334, and the cathode electrode 336, which are transparent, are formed in the transparent area TA of the display area DA.

Accordingly, the display device 300 according to the third embodiment of the present disclosure can show the surrounding environment information such as the background through the transparent area TA while displaying the image information through the emission area EA.

Meanwhile, as described above, the first pad electrode 341, the first connection electrode 342 and the first pad terminal 343 are disposed in the first contact portion CA1 on the first substrate 320, and the second pad electrode 344, the second connection electrode 345 and the second pad terminal 346 are disposed in the second contact portion CA2 on the first substrate 320.

Here, the first pad electrode 341 and the second pad electrode 344 are formed between the buffer layer 311 and the interlayer insulation layer 312. The first pad electrode 341 and the second pad electrode 344 can be formed of the same material and through the same process as the gate electrode 323.

In addition, the first connection electrode 342 and the second connection electrode 345 are formed between the interlayer insulation layer 312 and the passivation layer 313. The first connection electrode 342 and the second connection electrode 345 contact the first pad electrode 341 and the second pad electrode 344 through the contact holes formed in the passivation layer 313, respectively. The first connection electrode 342 and the second connection electrode 345 can be formed of the same material and through the same process as the source and drain electrodes 324 and 325.

Further, the first pad terminal 343 and the second pad terminal 346 are formed on the passivation layer 313. The first pad terminal 343 and the second pad terminal 346 contact the first connection electrode 342 and the second connection electrode 345 through the contact holes formed in the passivation layer 313, respectively. Accordingly, the first pad terminal 343 and the second pad terminal 346 are electrically connected to the first pad electrode 341 and the second pad electrode 344 through the first connection electrode 342 and the second connection electrode 345, respectively.

The first pad terminal 343 and the second pad terminal 346 can be formed of the same material and through the same process as the auxiliary drain electrode 328 and the first auxiliary electrode 329. Therefore, each of the first pad terminal 343 and the second pad terminal 346 can have a triple-layered structure including a first layer 343a and 346a, a second layer 343b and 346b, and a third layer 343c and 346c.

Next, the color filter layer 352 and the black matrix 354 are formed under the second substrate 350, that is, formed in the emission area EA of the display area DA on the inner surface of the second substrate 350. The color filter layer 352 and the black matrix 354 are not disposed in the transparent area TA.

Here, the second substrate 350 can be a glass substrate or a plastic substrate. For example, polyimide (PI) or polycarbonate (PC) can be used for the plastic substrate, but is not limited thereto.

The color filter layer 352 can be disposed to correspond to the light-emitting diode 330 and can include one of red, green and blue color filters. In addition, the black matrix 354 can be disposed at edges of the emission area EA. The black matrix 354 can be also formed in the non-display area NDA, and for example, the black matrix 354 can be extended into the second contact portion CA2 of the non-display area NDA.

As shown in the figure, thicknesses of the color filter layer 352 and the black matrix 354 can be the same. Alternatively, the thicknesses of the color filter layer 352 and the black matrix 354 can be different, and in this case, a planarization layer can be further on the color filter layer 352 and the black matrix 354 to protect the color filter layer 352 and the black matrix 354 and have a flat surface.

Meanwhile, the color filter layer 352 and the black matrix 354 can be omitted.

The first electrode 362 is formed on the color filter layer 352 and the black matrix 354 substantially all over the second substrate 350. Accordingly, the first electrode 362 is disposed in both the display area DA and the non-display area NDA.

The first electrode is formed of a transparent conductive material. For example, the first electrode 362 can be formed of indium tin oxide (ITO), indium zinc oxide (IZO), metal oxide, silver nanowire or carbon nanotube, but is not limited thereto.

The piezoelectric layer 364 is formed on the first electrode 362 in the emission area EA of the display area DA. The piezoelectric layer 364 can be extended into the second contact portion CA2 of the non-display area NDA.

The piezoelectric layer 364 is formed of a piezoelectric polymer in which mechanical deformation is generated by an electrical signal. The piezoelectric polymer can be a cellulose-based electro-active polymer or polyvinylidene fluoride.

Here, the cellulose-based electro-active polymer can have a structure expressed by the chemical formula 1 discussed above.

The piezoelectric layer 364 is stretched along a first direction. Therefore, molecules of the piezoelectric layer 364 are arranged in the first direction, and the piezoelectric effect is maximized.

Here, the piezoelectric layer 364 can be mechanically stretched. Alternatively, the piezoelectric layer 364 can be chemically stretched using corona discharge or a magnetic field.

Meanwhile, the piezoelectric layer 364 can include dichroic dyes. Here, the dichroic dyes can be iodine. The dichroic dyes can be arranged along the stretching direction of the piezoelectric layer 364, that is, the first direction.

The piezoelectric layer 364 including the dichroic dyes has a polarizing function. At this time, as the content of the dichroic dyes increases, the optical properties decrease. Thus, the dichroic dyes are beneficially contained such that the degree of polarization of the piezoelectric layer 264 is 90% to 99% and the transmittance including the surface reflectance is 40% to 45%. For example, the content of the dichroic dyes can be 2 to 30 parts by weight based on 100 parts by weight of the piezoelectric polymer forming the piezoelectric layer 364, preferably 5 to 20 parts by weight, and more preferably 6 to 15 parts by weight. However, the content of the dichroic dyes in the present disclosure is not limited thereto as long as the degree of polarization and the transmittance are satisfied.

The second electrode 366 is formed on the piezoelectric layer 364 in the emission area EA of the display area DA. The second electrode 366 is not formed in the transparent area TA. Meanwhile, the second electrode 366 can be extended into the second contact portion CA2 of the non-display area NDA.

The second electrode 366 is formed of a transparent conductive material. For example, the second electrode 366 can be formed of indium tin oxide (ITO), indium zinc oxide (IZO), metal oxide, silver nanowire or carbon nanotube, but is not limited thereto.

The second electrode 366 can be formed of the same material as the first electrode 362. Alternatively, the second electrode 366 can be formed of a different material from the first electrode 362.

The first electrode 362, the piezoelectric layer 364 and the second electrode 366 constitute the piezoelectric element 360.

The phase retardation film 370 is formed in the emission area EA of the display area DA on the second electrode 366. The phase retardation film 370 is not formed in the transparent area TA. Meanwhile, the phase retardation film 370 can be extended into the second contact area CA2 of the non-display area NDA.

The phase retardation film 370 can be a quarter wave plate (QWP) having a phase retardation value of λ/4 and changing a polarization state of light. The phase retardation film 370 changes incident linearly polarized light into circularly polarized light and changes incident circularly polarized light into linearly polarized light. An optical axis of the phase retardation film 370 forms 45 degrees with respect to the stretching direction of the piezoelectric layer 364, that is, the first direction.

The phase retardation film 370 can be formed by coating and polymerizing a reactive mesogen. In this case, an alignment layer can be further formed to arrange the reactive mesogen. Alternatively, the phase retardation film 370 can be formed of polycarbonate, tri-acetyl cellulose (TAC), acryl, or polyethylene terephthalate (PET), but is not limited thereto.

A filling layer 380 is formed in the display area DA between the first substrate 310 and the second substrate 350. Namely, in the emission area EA of the display area DA, the filling layer 380 can be disposed between the phase retardation film 370 and the cathode electrode 336 of the light-emitting diode 330, and in the transparent area TA of the display area DA, the filling layer 380 can be disposed between the first electrode 362 and the cathode electrode 336. The filling layer 380 can be formed of a photocurable or thermosetting material.

A seal pattern surrounding the display area DA is formed in the non-display area NDA between the first substrate 310 and the second substrate 350. The seal pattern can be a dam structure, and the filling layer 380 can be disposed inside the seal pattern.

Meanwhile, in the non-display area NDA between the first substrate 310 and the second substrate 350, a silver paste 392 is formed in the first contact portion CA1, and a conductive spacer 394 is formed in the second contact portion CA2.

In the first contact portion CA1, a first end of the silver paste 392 contacts the first electrode 362, and a second end of the silver paste 392 contacts the first pad terminal 343. Further, in the second contact portion CA2, a first end of the conductive spacer 394 contacts the second electrode 366, and a second end of the conductive spacer 394 contacts the second pad terminal 346. Accordingly, the first electrode 362 and the second electrode 366 of the piezoelectric element 360 formed on the second substrate 350 receive signals from a driving circuit connected to the first substrate 310.

At this time, the conductive spacer 394 can contact the cathode electrode 336 of the light-emitting diode 330. Thus, the second electrode 366 can be connected to the cathode electrode 336 and can be applied with the same signal as the cathode electrode 336.

As described above, the display device 300 according to the third embodiment of the present disclosure includes the emission area EA and the transparent area TA and shows the surrounding environment information such as the background through the transparent area TA while displaying the image information through the emission area EA.

Meanwhile, the display device 300 according to the third embodiment of the present disclosure includes the piezoelectric element 360 in the display area DA. When an electrical signal is applied to the first and second electrodes 362 and 366 of the piezoelectric element 360, vibration occurs in a direction perpendicular to the piezoelectric layer 364, thereby emitting sound waves. Accordingly, the piezoelectric element 360 can function as a speaker.

In addition, the piezoelectric layer 364 of the piezoelectric element 360 is stretched along the first direction and includes dichroic dyes such as iodine. Therefore, the piezoelectric element 360 can function as a polarizer.

The display device of the present disclosure includes the piezoelectric element functioning as a speaker and a polarizer. A separate speaker and a separate polarizer can be omitted, and manufacturing costs can be reduced. Accordingly, it is possible to implement the display device with a light weight, slim thickness and compact size, and it is possible to make better use of a space.

In addition, since sound output directly from the piezoelectric element can be heard, the sound quality can be improved, and the sense of realism and the three-dimensional effect can be felt, thereby enhancing the immersion.

Further, the display device of the present disclosure includes the emission area and the transparent area, and shows the surrounding environment information such as the background through the transparent area while displaying the image information through the emission area.

It will be apparent to those skilled in the art that various modifications and variations can be made in a display device of the present disclosure without departing from the sprit or scope of the embodiments. Thus, it is intended that the present disclosure covers the modifications and variations of this invention provided they come within the scope of the appended claims and their equivalents.

What is claimed is:

1. A display device comprising:
   a first substrate and a second substrate at which a display area for displaying an image and a non-display area surrounding the display area are provided;
   a light-emitting diode in the display area on an inner surface of the first substrate, the light-emitting diode including an anode electrode, a light-emitting layer and a cathode electrode; and
   a piezoelectric element in the display area on an inner surface of the second substrate, the piezoelectric element including a first electrode, a piezoelectric layer and a second electrode,
   wherein the piezoelectric layer includes dichroic dyes.

2. The display device of claim 1, wherein the piezoelectric layer is formed of a piezoelectric polymer, and the piezoelectric polymer includes a cellulose-based electro-active polymer or polyvinylidene fluoride.

3. The display device of claim 1, wherein the dichroic dyes are iodine.

4. The display device of claim 1, wherein the first and second electrodes are formed of transparent indium tin oxide, indium zinc oxide, metal oxide, silver nanowire, or carbon nanotube.

5. The display device of claim 1, wherein the piezoelectric layer is stretched along a first direction and transmits linearly polarized light of a second direction perpendicular to the first direction.

6. The display device of claim 5, further comprising a phase retardation film between the piezoelectric element and the light-emitting diode.

7. The display device of claim 6, wherein the phase retardation film is a quarter wave plate having a phase retardation value of λ/4, and an optical axis of the phase retardation film forms approximately 45 degrees with respect to the first direction.

8. The display device of claim 6, further comprising a filling layer,
wherein the filling layer is disposed between the light-emitting diode of the first substrate and the phase retardation film of the second substrate.

9. The display device of claim 1, further comprising a color filter layer and a black matrix between the second substrate and the first electrode.

10. The display device of claim 1, wherein the second electrode is connected to the cathode electrode.

11. The display device of claim 1, wherein the display area includes an emission area and a transparent area, and the light-emitting diode and the piezoelectric element are disposed in the emission area.

12. The display device of claim 11, wherein the first electrode is further formed in the transparent area.

13. The display device of claim 11, further comprising at least one thin film transistor in the emission area on the first substrate,
wherein the anode electrode is connected to the at least one thin film transistor.

14. The display device of claim 11, further comprising a bank overlapping edges of the anode electrode on the first substrate.

15. The display device of claim 14, further comprising an auxiliary electrode in the emission area on the first substrate, wherein the cathode electrode is connected to the auxiliary electrode.

16. The display device of claim 15, further comprising a partition wall on the auxiliary electrode,
wherein the auxiliary electrode is exposed between the bank and the partition wall.

17. The display device of claim 16, wherein the partition wall includes a first pattern and a second pattern,
the second pattern is disposed on the first pattern, and
the second pattern covers a top surface and part of side surfaces of the first pattern.

18. The display device of claim 11, further comprising a color filter layer and a black matrix in the emission area on the inner surface of the second substrate.

19. The display device of claim 18, wherein the color filter layer and the black matrix are disposed between the second substrate and the first electrode.

20. The display device of claim 18, further comprising a phase retardation film in the emission area on an inner surface of the second substrate,
wherein the phase retardation film is disposed between the piezoelectric element and the light-emitting diode.

21. The display device of claim 11, wherein the non-display area includes a first contact portion and a second contact portion,
wherein first and second pad electrodes are formed in the first and second contact portions on the first substrate, respectively, and
wherein the first electrode is connected to the first pad electrode through a silver paste, and the second electrode is connected to the second pad electrode through a conductive spacer.

22. The display device of claim 21, wherein the conductive spacer contacts the cathode electrode.

23. The display device of claim 1, wherein the piezoelectric element functions as a speaker and a polarizer of the display device.

* * * * *